United States Patent
Torres et al.

(10) Patent No.: US 8,138,082 B2
(45) Date of Patent: Mar. 20, 2012

(54) METHOD FOR FORMING METAL INTERCONNECTS IN A DIELECTRIC MATERIAL

(75) Inventors: Joaquin Torres, St. Martin le Vinoux (FR); Vincent Arnal, Grenoble (FR); Laurent-Georges Gosset, Crolles (FR); Wim Besling, Saint-Nazaire-les-Eymes (FR)

(73) Assignees: STMicroelectronics (Crolles 2) SAS, Crolles Cedex (FR); Koninkljike Philips Electronics N.V., Ba Eindhoven (NL)

( * ) Notice: Subject to any disclaimer, the term of this patent is extended or adjusted under 35 U.S.C. 154(b) by 0 days.

(21) Appl. No.: 12/280,978

(22) PCT Filed: Feb. 26, 2007

(86) PCT No.: PCT/IB2007/000455
§ 371 (c)(1),
(2), (4) Date: Mar. 25, 2009

(87) PCT Pub. No.: WO2007/099428
PCT Pub. Date: Sep. 7, 2007

(65) Prior Publication Data
US 2009/0218699 A1    Sep. 3, 2009

(30) Foreign Application Priority Data
Feb. 28, 2006    (EP) .................... 06290339

(51) Int. Cl.
*H01L 21/4763* (2006.01)
(52) U.S. Cl. ........ 438/618; 438/623; 438/639; 438/696; 257/E21.585

(58) Field of Classification Search .................. 438/618, 438/623, 627, 639
See application file for complete search history.

(56) References Cited

U.S. PATENT DOCUMENTS

| 6,291,333 | B1 | 9/2001 | Lou | |
|---|---|---|---|---|
| 7,338,893 | B2 * | 3/2008 | Engbrecht et al. | 438/627 |
| 7,651,942 | B2 * | 1/2010 | Huebinger et al. | 438/639 |
| 2003/0116854 | A1 * | 6/2003 | Ito et al. | 257/761 |
| 2004/0092095 | A1 | 5/2004 | Nguyen et al. | |
| 2004/0135255 | A1 | 7/2004 | Matsunaga et al. | |
| 2005/0148202 | A1 | 7/2005 | Heiliger et al. | |
| 2007/0202676 | A1 * | 8/2007 | Yeh et al. | 438/597 |

FOREIGN PATENT DOCUMENTS

| EP | 1324383 A2 | 7/2003 |
|---|---|---|
| WO | WO-2004107434 A1 | 12/2004 |

OTHER PUBLICATIONS

Ching-Fa Yeh, et al., "$O_2$-Plasma Degradation of Low-κ Organic Dielectric and its Effective Solution for Damascene Trenches," American Vacuum Society, 2000 5th International Symposium on Plasma Process-Induced Damage, Santa Clara, CA, USA; pp. 81-84, May 23-24, 2000.

PCT International Search Report and Written Opinion cited in Application No. PCT/182007/000455, dated Jun. 14, 2007 (11 pages).

* cited by examiner

*Primary Examiner* — Thanh Nguyen
(74) *Attorney, Agent, or Firm* — Gardere Wynne Sewell LLP

(57) ABSTRACT

A semiconductor device includes an interconnect having electrically conductive portions and a dielectric layer made of a first dielectric material. A trench is formed in the dielectric layer. The exposed portions of the dielectric layer which form the side walls of the trench are removed. A dielectric liner is then deposited on the side walls of the trench, the liner being made of a second dielectric material.

19 Claims, 6 Drawing Sheets

METHOD FOR FORMING METAL INTERCONNECTS IN A DIELECTRIC MATERIAL

PRIORITY CLAIM

This application is a filing under 35 U.S.C. 371 of International Application No. PCT/IB2007/000455 filed Feb. 26, 2007, which claims priority from European Application No. 06290339.8 filed Feb. 28, 2006, the disclosures of which are hereby incorporated by reference.

FIELD OF THE INVENTION

The present invention relates generally to the field of interconnects made of an electrically conductive material in a dielectric material, and more particularly but not exhaustively to metal interconnects in a dielectric material having a relatively low permittivity, i.e. low-k or ultra-low-k (ULK) materials.

BACKGROUND OF THE INVENTION

Such interconnects may be employed in semiconductor devices, e.g. integrated circuits (ICs).

In conventional ICs, it is necessary to establish electrical contact between conductive layers that are formed on different levels of metallization and separated by dielectric layers.

An IC interconnect may thus comprise vias and lines for interconnecting different parts of an underlying semiconductor substrate on which components, e.g. transistors, are formed. A line extends in a plane parallel to the plane of the semiconductor substrate. A via extends in a direction perpendicular to the plane of the semiconductor substrate, through a dielectric layer. Both the lines and the vias are formed by depositing electrically conductive material within a stack of patterned dielectric layers.

Improvements in the performance of semiconductor devices (speed, low power consumption) have required a large number of changes of the materials that have been used up till now.

In order to reduce the capacitance that exists between the lines formed in a layer of dielectric material, dielectric materials with a low permittivity coefficient "k", typically lower than 4.2, or with an ultra-low-k, typically lower than 2.4, may be used. The interline capacitance is indeed proportional to the permittivity coefficient k of the dielectric material that is used. The ULK dielectric materials may comprise porous materials. The porous materials have a relatively low density.

The improvements in the performance have also been achieved through the use of an electrically conductive material that is more conductive than aluminum, which has traditionally been used to make the interconnect lines. Copper, whose resistivity is nearly half that of aluminum doped with copper, has shown itself to be the best candidate.

The use of ULK dielectric materials and copper allow for reduction in the capacitance C that exists between the lines and the resistance R of the interconnect respectively. The value of the propagation constant RC may hence be reduced. A semiconductor device with a propagation constant RC having a relatively low value may thus operate properly at relatively high frequencies; stated otherwise, the new materials allow for improvement in the performance of semiconductor devices.

These new materials may be employed in the well-known Damascene or Dual Damascene processes. To obtain a metallization level n, a dielectric layer made of a first dielectric material is deposited on a layer of level n−1. Trenches are etched within the dielectric layer, the trenches corresponding to portions of the interconnect, e.g. lines and vias. A metallization operation, in which a thin metallic barrier is deposited, is performed and the electrically conductive material is subsequently deposited so as to fill the trenches and polished until it is level with the upper surface of the dielectric layer.

The Damascene or Dual Damascene processes are well suited for producing copper lines and vias because, although copper has advantageous electrical properties for narrow lines, it cannot be etched at ambient temperature. Additionally, the Damascene and Dual Damascene processes may be used with other metals used to form lines and vias.

During the Damascene or Dual Damascene processes, the etching of the trenches may be followed by other patterning operations such as stripping and cleaning. The stripping operation allows for removal of residues of photosensitive resin, and/or the residues of the etch chemistry. Wet cleaning operations may also be performed to remove contaminants.

However, a patterning operation, i.e. etching, stripping and/or cleaning, may damage a portion of the dielectric layer. For example, cleaning solutions used for stripping etch residues may penetrate into the already damaged dielectric layer and provide an additional deterioration of the dielectric layer.

In the case of porous dielectric materials, the dielectric layer may comprise a damaged portion on the walls of the trenches. The damaged portion may have a relatively large width, e.g. 10 or 20 nm.

The permittivity of the damaged portion is higher than the permittivity of the first dielectric material, thus increasing a total permittivity of the etched dielectric layer. For example, the interline permittivity of a deposited dielectric layer may rise from 2.4 to 3.5 after the patterning operations. The interline capacitance being proportional to the overall permittivity, the damaging of the dielectric layer by the patterning operation leads to an increase of the interline capacitance and of the propagation constant RC.

Furthermore, a porous dielectric material may be hydrophilic. If water molecules penetrate into the dielectric layer, the overall permittivity may also increase. The water molecules may also disturb the operation of the semiconductor device.

Furthermore, metal containing precursor molecules used for a vapor deposition of the thin metallic barrier may diffuse into the pores of the porous dielectric layer, which may lead to a short circuit. If the thin metallic barrier has discontinuities, copper atoms or copper ions may also penetrate into the dielectric layer.

There is thus a need for a dielectric layer having a small overall permittivity and in which the pores are protected from diffusion of water or metal molecules.

It is known in the art to provide an intentional densification of the dielectric material on the side walls of the trench. The intentional densification may be performed after the etching, for example using a surface treatment or plasma bombardment.

The densification provides a relative closing of the pores of the damaged portion. The relative closing of such peripheral pores allows avoiding diffusion of water and metal molecules.

However, by locally increasing the dielectric permittivity, the intentional densification also increases the overall permittivity of the dielectric layer. Furthermore, a certain width is required for the damaged portion to protect the pores from diffusion. As the dimensions of the semiconductor devices shrink, the ratio between the volume of the damaged portion and the global volume of the etched dielectric layer increases, thus increasing the global permittivity of the dielectric layer and increasing the propagation constant RC.

It is also known in the art to deposit a capping layer on the etched dielectric layer to protect the pores of the dielectric layer from diffusion. See, "O$_2$-Plasma Degradation of Low-K Organic Dielectric and its Effective Solution for Damascene Trenches", Ching-Fa Yeh et al., 2000 5$^{th}$ International Symposium on Plasma Process-Induced Damage, which describes such a capping operation.

The capping layer may be made of a dielectric material having a relatively higher permittivity and a relatively higher density than the porous dielectric material of the dielectric layer. Hence, the capping layer allows to shield the pores from diffusion of water molecules or metal containing molecules, e.g. tantalum containing vapor used in atomic layer deposition (ALD) or chemical vapor deposition (CVD). The thin metallic barrier may subsequently be deposited on the capping layer without metallic deposition inside the porous dielectric material.

However, the depositing of the capping layer reduces the volume to be filled with copper, which may cause problems in filling the trenches with copper. Furthermore, the resistivity of the interconnect may increase when the section of the interconnect becomes in the order of the mean free path of the electron. As the dimensions of the semiconductor devices shrink, the capping leads inevitably to an increase of the resistance of the interconnect, and thus to an increase of the value of the propagation constant RC.

As a consequence, there is still a need for a semiconductor device comprising an interconnect made of an electrically conductive material in a dielectric layer and having a relatively low propagation constant value RC.

SUMMARY OF THE INVENTION

In a first aspect, the present invention provides a method for manufacturing a semiconductor device comprising an interconnect comprising electrically conductive portions, in a dielectric layer made of a first dielectric material, said method comprising
  forming a trench in said dielectric layer;
  removing exposed portions of the dielectric layer which form the side walls of the trench; and
  depositing a dielectric liner on the side walls of the trench, the liner being made of a second dielectric material.

The forming of the trench may comprise patterning operations, e.g. etching, stripping and/or wet cleaning, that may damage at least a portion of the dielectric layer. Such damaged portions are at least partially removed by the removing step and at least partially replaced by the deposited dielectric liner.

The removal allows for avoiding an overall permittivity increase between the further interconnects, as may be the case if an intentional densification of the dielectric layer is performed on the side walls of the trench.

Advantageously, the first dielectric material and the second dielectric material are distinct. The deposited dielectric liner may have satisfying low-k value and relatively good interaction properties with a further metallic barrier, thus achieving a proper pore sealing.

The thickness of the deposited dielectric liner may be chosen so as to avoid a significant increase of an overall permittivity between the further interconnects, while assuring a proper protection of the pores of the dielectric layer. Also, the thickness of the deposited dielectric liner may be chosen to be smaller than or substantially equal to the thickness of the removed portions, so as to avoid reducing the volume to be filled with an electrically conductive material, as may be the case if a capping layer is deposited directly on the damaged dielectric layer. Furthermore, the control of the liner thickness may also allow one to control the section of the further interconnect.

Also, several dielectric liners may be deposited. For example, a relatively porous dielectric liner may be deposited first, followed by a relatively dense dielectric liner. The relatively dense dielectric liner allows sealing the pores of the relatively porous dielectric liner and of the dielectric layer.

More generally, several parameters, e.g. density, permittivity, thickness, etc. may be controlled, thus allowing a better control of the properties of the semiconductor device. Typically, the parameters may be chosen so as to provide a semiconductor device having a relatively low propagation constant value RC.

Alternatively, the first dielectric material and the second dielectric material may be similar.

The removing step may be performed immediately after the forming of the trench. Alternatively, one or more operations, e.g. an annealing operation, may be performed between the forming of the trench and the removing of exposed portions on side walls of the trench.

The dielectric liner deposition may be performed immediately after the removal. Alternatively, one or more operations, e.g. an annealing operation, may be performed between the removal of exposed portions on side walls of the trench and the deposition of the dielectric liner on the side walls of the trench.

Furthermore, the manufacturing method according to an aspect of the invention may involve well-known operations and products and is therefore relatively easy to achieve.

Advantageously, the removing of the exposed portions of the dielectric layer comprises selectively removing damaged portions of the dielectric layer. Only the damaged portions are removed.

For example, the removing of the damaged portion of the dielectric layer may be performed using a Hydrogen Fluoride (HF) based wet solution. The HF based wet solution may selectively dissolve the damaged portions of the dielectric layer, while leaving undamaged portions of the dielectric layer unaffected.

Any other selective removal technique may be used.

Alternatively, the removing may for example be time controlled, i.e. the removing operation is stopped after a determined duration. The duration may be determined experimentally, or theoretically, as allowing a total removal of the damaged portions.

The depth of the removed portions may be controlled by any other method.

The removing of the damaged portions may advantageously be total, so as to avoid leaving damaged zones. Alternatively, the damaged zones may be only partially removed.

Advantageously, the manufacturing method further comprises providing an anisotropic etching of the deposited dielectric liner to open an underlying electrically conductive zone; and depositing a thin metallic barrier.

The anisotropic etching allows etching a bottom portion of the deposited dielectric liner. The bottom portion of the deposited dielectric liner may indeed contact an electrically conductive zone, e.g. a contact point of a transistor, a via, or a line of the interconnect. The bottom portion of the deposited dielectric liner has to be removed to establish an electrical contact between said electrically conductive zone and a further electrically conductive portion, e.g. a via, of the interconnect.

The anisotropic etching may leave the deposited dielectric liner on side walls of the trench.

The anisotropic etching may also allow for removal of possible overhangs formed around masking layers. The anisotropic etching may possibly remove masking layers at a surface of the dielectric layer.

Alternatively, a thin metallic barrier is deposited on the deposited dielectric liner. An anisotropic etching of the deposited thin metallic barrier and of the deposited dielectric liner is subsequently performed, so as to open the underlying electrically conductive zone. Such a punch through approach allows for removal of a bottom portion of the deposited thin metallic barrier and the bottom portion of the deposited dielectric liner, thus allowing an electrical contact between the electrically conductive zone and a further electrically conductive portion of the interconnect.

Advantageously, a seed layer made of an electrically conductive material is deposited and a bulk made of the electrically conductive material is also deposited via electroplating.

Alternatively, any other method allowing for filling of the trench with the electrically conductive material may be performed instead.

Advantageously, a polishing operation may be performed to level the deposited electrically conductive material and a surface of the dielectric layer. Also, the polishing operation may allow for removal of possible masking layers.

Alternatively, any other operation allowing for leveling of the deposited electrically conductive material and a surface of the dielectric layer may be performed.

A thin barrier of dielectric material may or may not be deposited on the polished surface. The thin barrier of dielectric material may prevent diffusion of atoms or ions of the electrically conductive material into a further dielectric layer.

Advantageously, the electrically conductive portions comprise copper, which is a relatively conductive material.

However, any other electrically conductive material may be used.

Advantageously, the permittivity of the first dielectric material may be lower than 4.2, or even lower than 2.4.

Advantageously, the dielectric layer may comprise porous material.

The first dielectric material may advantageously be selected from the group consisting of silicon dioxide ($SiO_2$), carbon-incorporated silicon oxide (SiOC), oxycarbide (SiOCH), Fluorine doped silicate Glass (FSG), Phosphosilicate Glass (PSG) and boro-phospho-silicate glass (BPSG).

However, any other suitable material may be employed as a first dielectric material.

These and other aspects of the invention will be apparent from and elucidated with reference to the embodiments described hereinafter.

BRIEF DESCRIPTION OF THE DRAWINGS

In all the figures, the same references denote similar or substantially similar elements.

DESCRIPTION OF THE PREFERRED EMBODIMENTS

FIGS. 1A to 1E illustrate an example of a known process to manufacture a copper interconnect in a dielectric material. In this example, a previous line 3 is formed in a previous dielectric layer 2' made of a first dielectric material, e.g. silicon dioxide ($SiO_2$). The electrically conductive material of the previous line 3, e.g. copper, is isolated from the silicon dioxide by a previous thin metallic barrier 7'. The thin metallic barrier 7' may comprise tantalum.

A thin barrier of dielectric material 4 is deposited on a surface of the previous dielectric layer 2'.

Figure 1A:
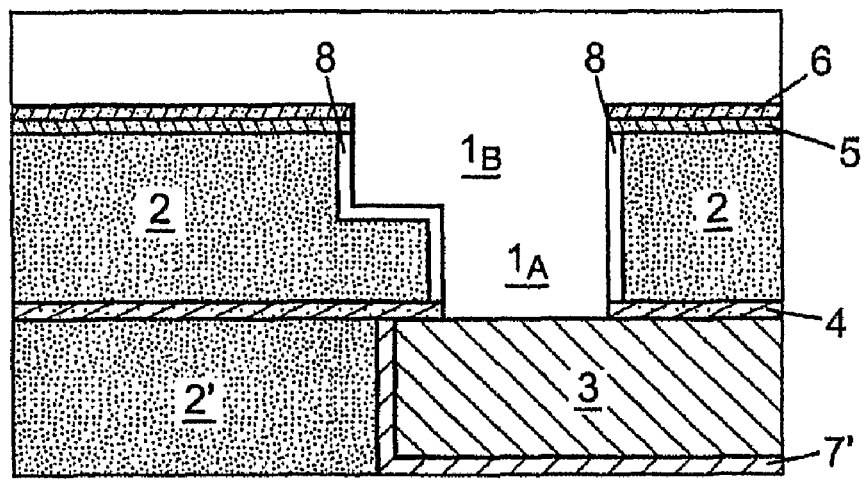
FIGS. 1A to 1E illustrate an example of a process to manufacture a copper interconnect in a dielectric layer according to Prior Art.

A dielectric layer 2 is deposited on the thin barrier of dielectric material 4. The dielectric layer may also comprise silicon dioxide. The Dual Damascene process allows to form trenches $1_A$, $1_B$ within the dielectric layer 2. Lithographic operations are performed to set the zones to be etched. The dielectric layer is subsequently etched, using for example a reactive ion etching plasma (RIE plasma). FIG. 1A illustrates a portion of a semiconductor device after such an etching operation.

However, the etching or other patterning operations, such as stripping and/or cleaning, may damage a portion of the dielectric layer. The dielectric layer may comprise a damaged portion 8 on the walls of the trenches $1_A$, $1_B$.

References 5 and 6 correspond to cap layers, which serve as hard mask layers for patterning purposes or CMP (Chemical Mechanical Polishing) stop layers.

Alternatively, the cap layers may be left out in different integration schemes.

Figure 1B:
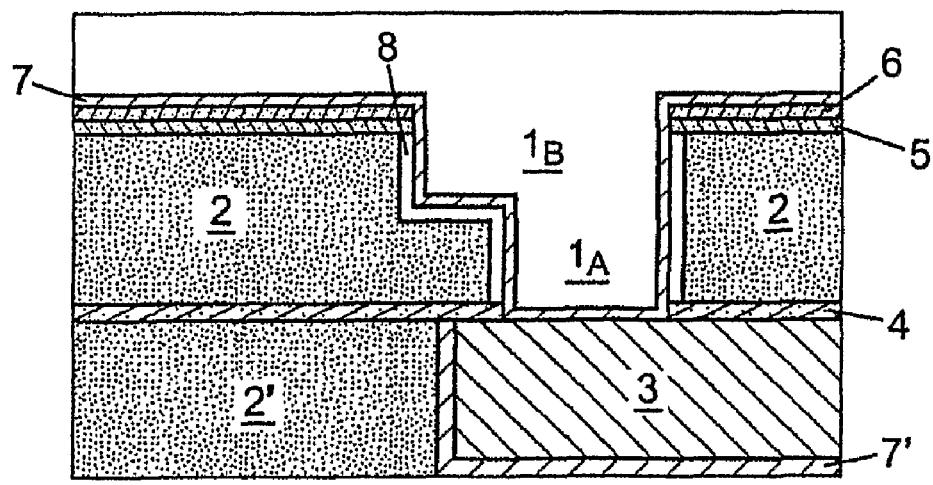

A metallization operation, in which a thin metallic barrier 7 is deposited, is subsequently performed, as illustrated in FIG. 1B. The thin metallic barrier 7 may comprise tantalum, or tantalum nitride. The thin metallic barrier 7 allows for preventing copper atoms or copper ions of a further interconnect to diffuse into the dielectric layer 2.

Figure 1C:
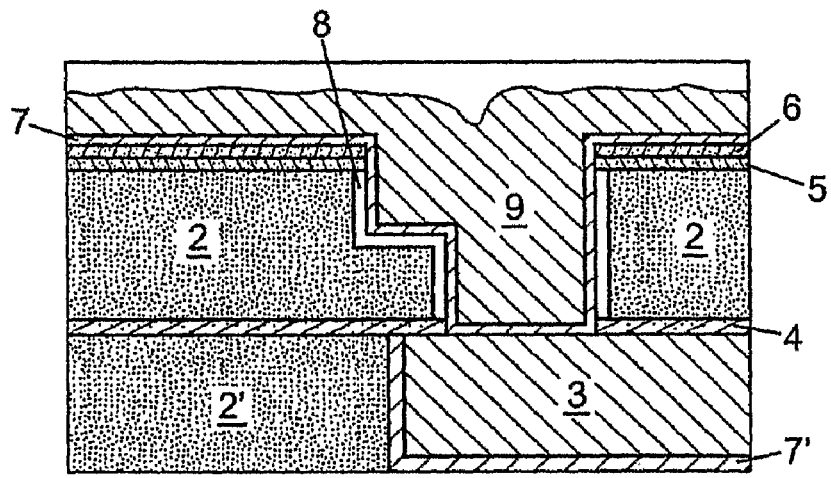

As illustrated in FIG. 1C, copper 9 is subsequently deposited so as to fill the trenches $1_A$, $1_B$. The depositing may be performed in two steps (not represented). First, a copper seed layer is deposited on the thin metallic barrier, for example via a Physical Vapor Deposition (PVD). Then copper bulk is deposited on the copper seed layer via electroplating.

Figure 1D:
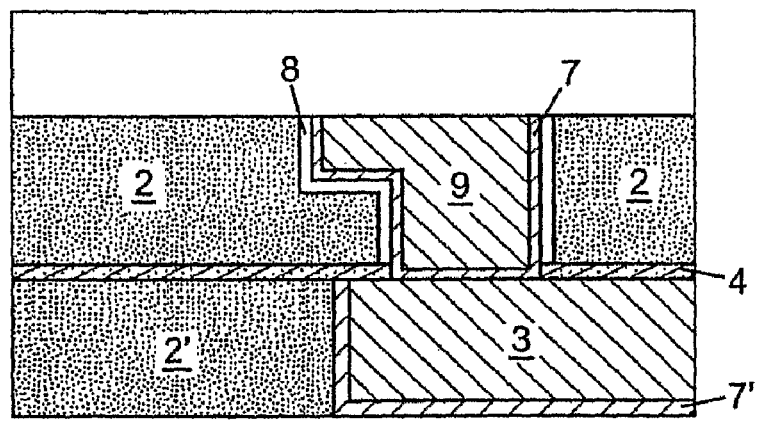

Polishing operations allow for a leveling of the deposited copper 9 with the surface of the dielectric material, as shown in FIG. 1D. Masking layers 5, 6 may be removed by the polishing. The polishing may for example be performed using a Chemical Mechanical Planarization (CMP).

Figure 1E:
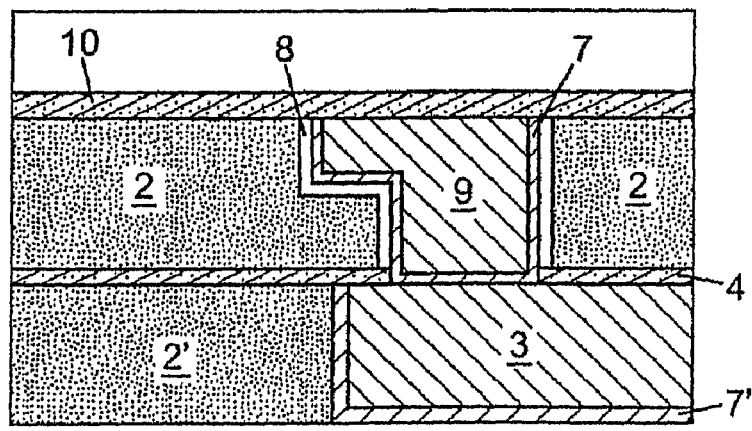

As illustrated in FIG. 1E, a thin barrier 10 of dielectric material may subsequently be deposited on the polished surface.

FIGS. 2A to 2G and FIGS. 3A to 3B illustrate exemplary embodiments of the present invention.

In the illustrated examples, a previous line 3 is formed in a previous dielectric layer 2' comprising a first dielectric material. The first dielectric material may comprise a porous ultra-low-k material. The porous ultra-low-k material may for example be made of carbon-incorporated silicon oxide (SiOC). The electrically conductive material of the previous line 3, e.g. copper, is isolated from the SiOC by a previous thin metallic barrier 7'. The thin metallic barrier 7' may comprise tantalum, tantalum nitride or any other suitable metal material.

A thin barrier of dielectric material 4 is deposited on a surface of the previous dielectric layer 2'.

A dielectric layer 2 is deposited on the thin barrier of dielectric material 4 by plasma enhanced chemical vapor deposition (PECVD) or by any other deposition method. The dielectric layer 2 may also comprise the porous SiOC ultra-low-k material. The dielectric layer may for example have a permittivity coefficient of 2.4. A Dual Damascene process allows to form trenches $1_A$, $1_B$ within the dielectric layer 2. Masking operations and lithographic operations are performed to set the zones to be etched. The dielectric layer is subsequently etched, using for example a reactive ion etching plasma (RIE plasma).

In the illustrated examples, the trenches comprise a first trench $1_A$, corresponding to a further via, and a second trench $1_B$, corresponding to a further line. A Dual Damascene process is performed, i.e. a single further deposition allows for the filling of the first trench $1_A$ and the second trench $1_B$.

In alternative embodiments (not represented), each trench is filled with copper before etching a new trench.

Typically, several trenches are etched simultaneously on a surface of a semiconductor device, each trench corresponding to an interconnect.

The etching may be followed by a stripping operation, and possibly by a wet cleaning operation.

Figure 2A:
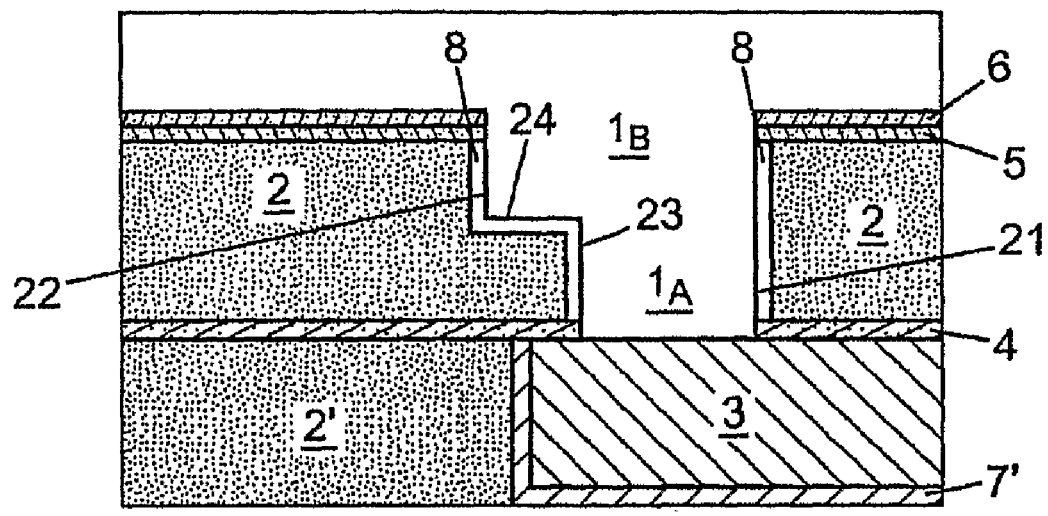
FIGS. 2A to 2G illustrates an example of a manufacturing method according to a first embodiment of the present invention.

FIG. 2A illustrates a portion of a semiconductor device after such patterning operations.

References 5 and 6 correspond to cap layers which serve as hard mask layers for patterning purposes or CMP stop layers. Alternatively, the cap layers may be left out in different integration schemes.

The patterning operations have led to a deterioration of a portion 8 of the dielectric layer 2. Pores of such a damaged portion 8 may be sealed and the damaged portion 8 may exhibit higher density and permittivity than the rest of the dielectric layer 2. The damaged portion 8 may stretch out as far as 10 nm, 20 nm or 30 nm. The deterioration may partially transform the first dielectric material, i.e. SiOC, into a distinct dielectric material, e.g. $SiO_2$.

Figure 2B:
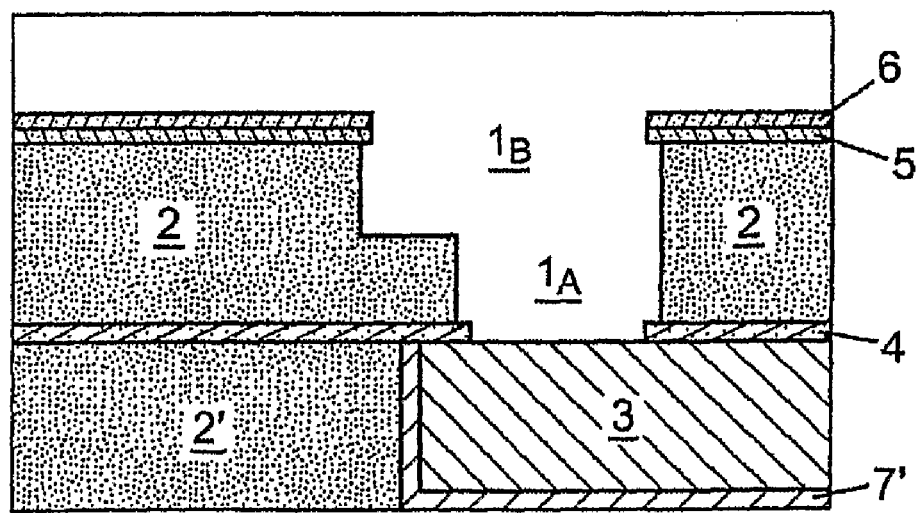

The exposed portions of the dielectric layer which form the side walls of the trenches $1_A$, $1_B$ are removed, as shown in FIG. 2B.

The removal is performed on side walls of the trenches $1_A$, $1_B$, i.e. substantially vertical walls 21, 22, 23. In this example, the removal is also performed on a substantially horizontal wall 24.

The removing is performed selectively, using for example a Hydrogen Fluoride (HF) wet based solution. Such a selective wet etching allows to remove the damaged dielectric material, i.e. $SiO_2$, while leaving the first dielectric material, i.e. SiOC, unaffected.

Figure 2C:
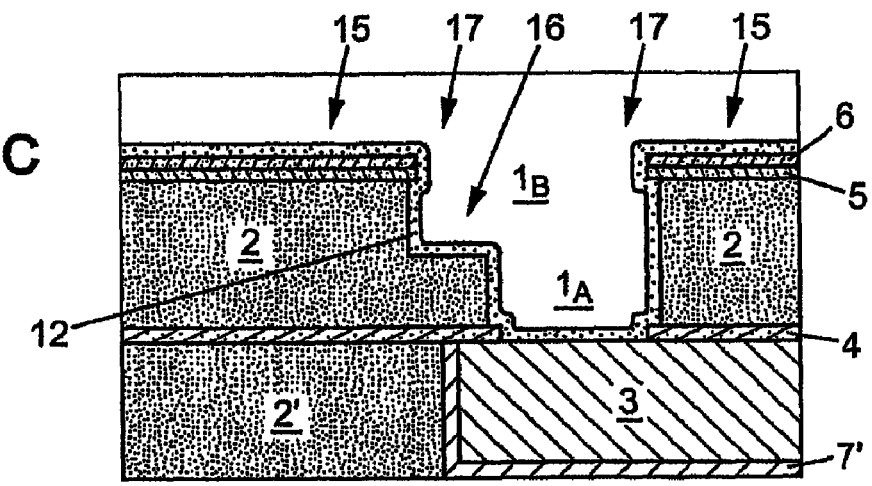

The removal is followed by a conformal deposition of a dielectric liner 12 made of a second dielectric material, as shown in FIG. 2C. The conformal depositing may for example comprise a thermal Chemical Vapor Deposition (CVD) of a benzocyclobutene (BCB) liner. A BCB material has a permittivity coefficient of 2.7.

Other liner materials, e.g. SiOC, silicon carbide (SiC), $SiO_2$ or polyarylene ether (SiLK), may also be used.

The dielectric liner 12 is deposited on the side walls of the trenches $1_A$, $1_B$, thus allowing a proper sealing of pores of the dielectric layer between interconnects. The dielectric liner 12 is also deposited on the previous line 3 and on the masking layers 5, 6.

First Embodiment

Figure 2D:
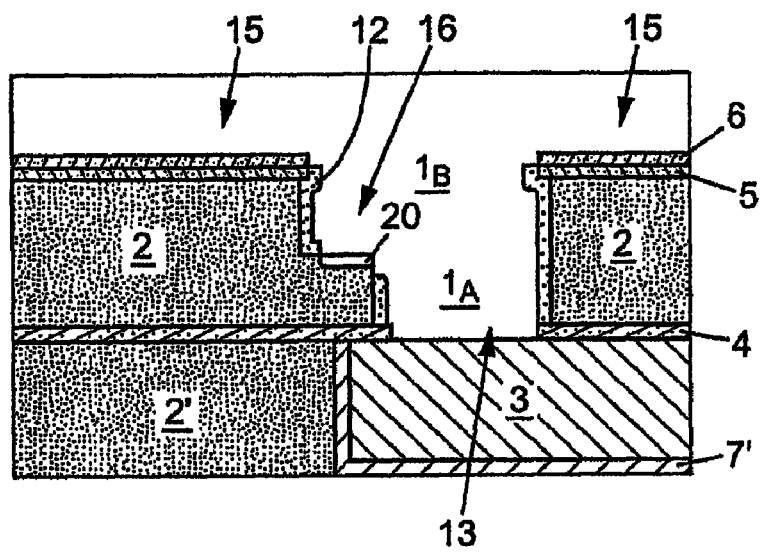

In the first embodiment, the conformal depositing is followed by a mask-less anisotropic etching, using for example fluoro carbon plasma etch ($CF_4$/Ar or $C_4F_8$/Ar). The anisotropic etching allows to open up a bottom portion 13 of the deposited dielectric liner 12, thus opening the copper of the previous line 3, as shown in FIG. 2D.

The anisotropic etching also allows for removal of surface portions 15 of the dielectric liner 12, and overhangs 17.

In this example, a step portion 16 of the liner 12 is also removed.

Figure 2E:
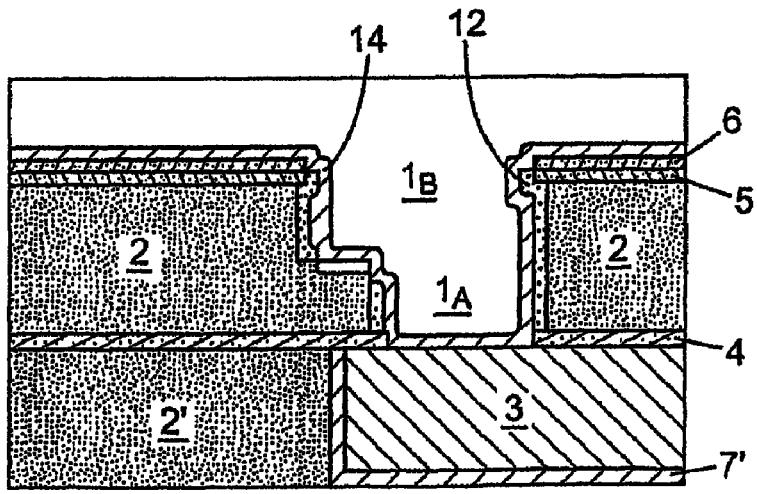

A thin metallic barrier 14 is subsequently deposited using a common metallization process, as shown in FIG. 2E. The thin metallic barrier 14 may comprise tantalum, or tantalum nitride. The thin metallic barrier 14 prevents copper atoms or copper ions of a further interconnect to diffuse into the dielectric liner 12.

The thin metallic barrier 14 may contact the first dielectric material at a step zone corresponding to at least a portion of the removed step portion 16. However, the anisotropic etching provides a densification of the ultra-low-k dielectric material at the step zone. The densification protects the porous ultra-low-k dielectric material from diffusion of metallic atoms or metallic ions.

Also, an intermediate stop layer may be used to protect the porous dielectric material from diffusion.

Furthermore, the step zone is not located between the further line portion $1_B$ and another further line portion (not represented) within the dielectric layer 2. The interline capacitance is hence relatively unaffected by a local increase of the permittivity.

Figure 2F:
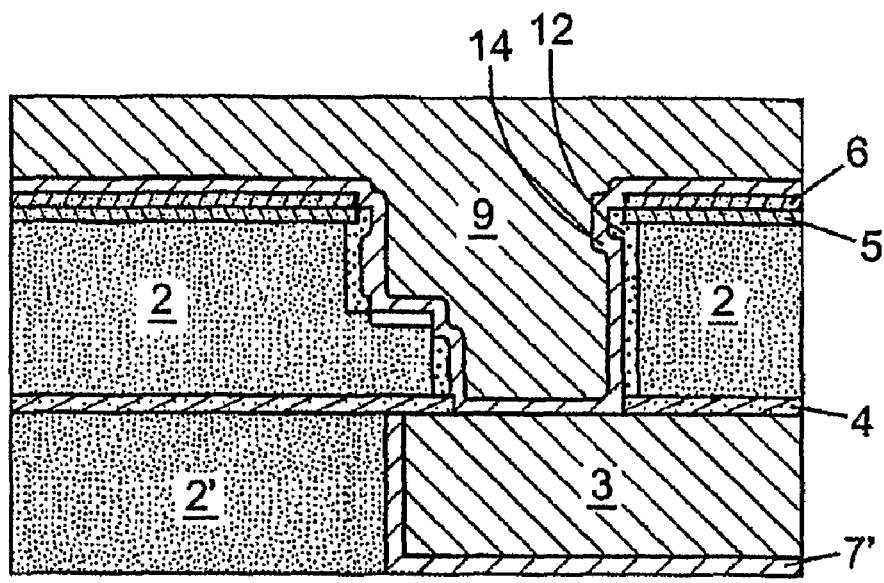

Copper 9 may be deposited within the trenches, as shown in FIG. 2F. The depositing may be performed in two steps (not represented). A copper seed layer is deposited and a copper bulk is subsequently deposited via electroplating.

A polishing operation may subsequently be performed so as to level the deposited copper with the dielectric layer 9. The polishing may also allow to remove the masking layers 5, 6.

Figure 2G:
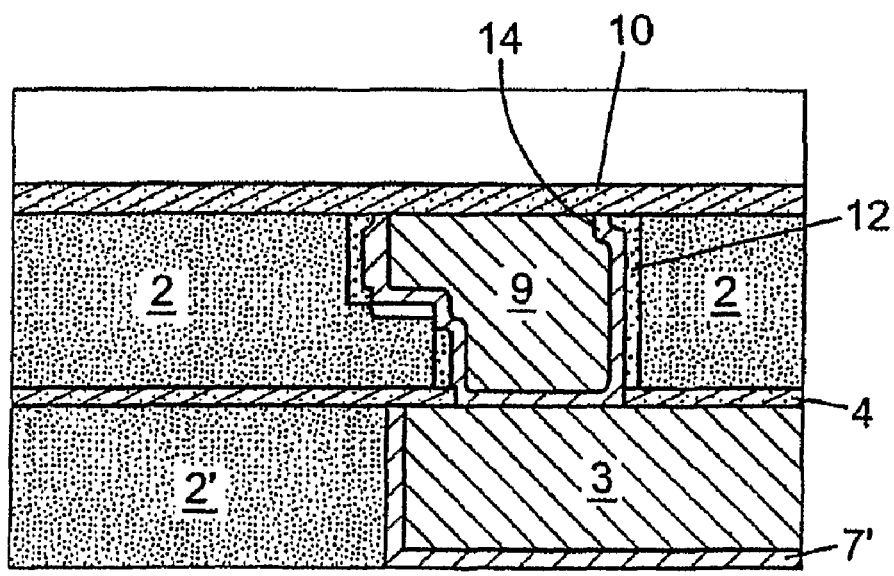

A thin barrier of dielectric material 10 may subsequently be deposited on the polished surface, as shown in FIG. 2G.

A further dielectric layer (not represented) may be deposited so as to manufacture a new copper portion, e.g. a new line or a new via.

Second Embodiment

Figure 3A:
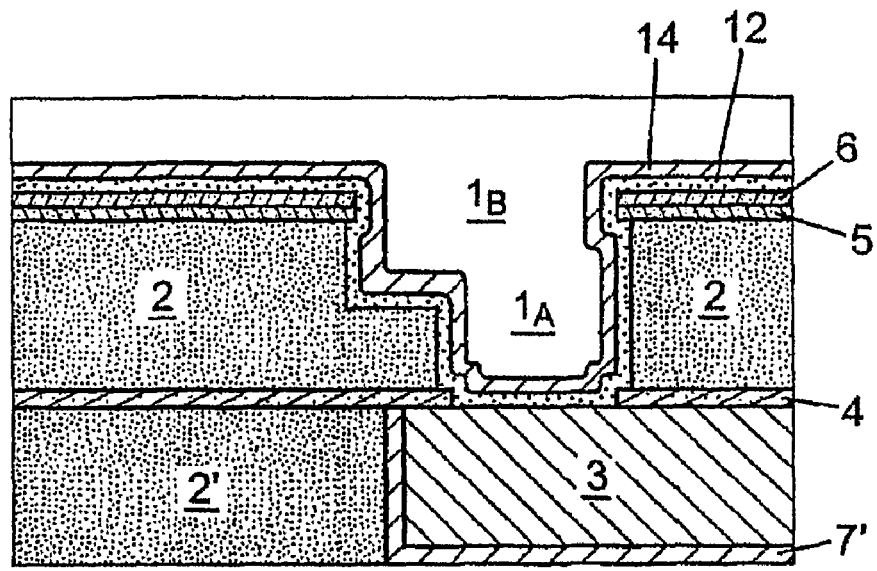
FIGS. 3A and 3B illustrates an example of a manufacturing method according to a second embodiment of the present invention.

In the second embodiment, the conformal depositing of the dielectric liner 12 is followed by a conformal depositing of a thin metallic layer 14, as shown in FIG. 3A.

The thin metallic layer 14 may possibly have a higher thickness at the bottom of the line $1_B$ than at the bottom of the via $1_A$, depending on the deposition technique.

Figure 3B:
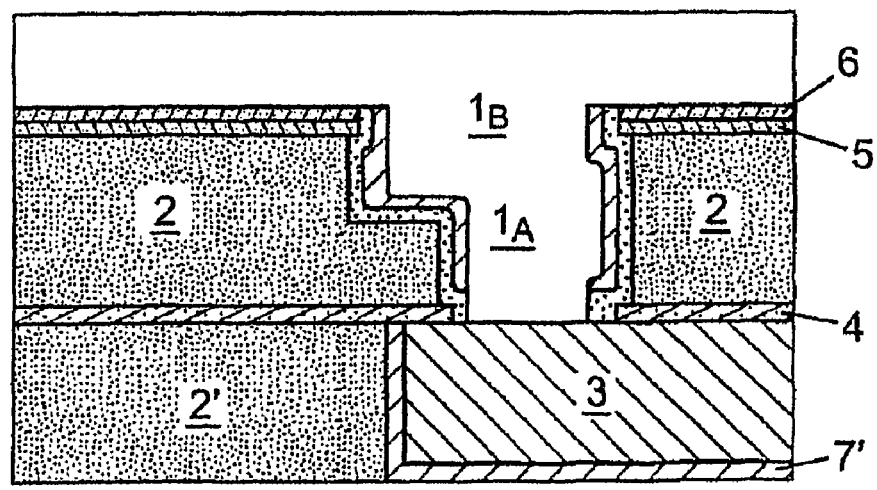

A subsequent anisotropic etching may be performed, so as to open the previous line 3 (see, FIG. 3B).

Such a punch through Physical Vapor Deposition (PVD) barrier process allows to remove surface portions of the thin metallic layer 14 and the dielectric liner 12.

An etch rate variation or a sputtering rate variation allows to remove the metal barrier 14 and the dielectric liner 12 preferentially at the bottom of via 1A. Typically, the liner 12 may be removed at the bottom of the via 1A and partially kept anywhere else in the structure, as shown in FIG. 3B.

Such a tuning of the punch through process therefore allows to open the bottom of the via 1A while keeping protected substantially vertical and substantially horizontal walls of the dielectric layer 2.

Further operations may be performed so as to achieve an interconnect structure within the dielectric layer 2. Typically, a subsequent metal barrier after punch through and copper are deposited within the trenches; a polishing operation is subsequently performed and a thin barrier of dielectric material is deposited on the polished surface.

In the description above, it will be understood that when an element such as layer, region or substrate is referred to as being "on" or "onto" another element, the element is either directly on the other element, or intervening elements may also be present.

Expressions such as "comprise", "include", "incorporate", "contain", "is" and "have" are to be construed in a non-exclusive manner when interpreting the description and its associated claims, namely construed to allow for other items or components which are not explicitly defined also to be present. Reference to the singular is also to be construed in be a reference to the plural and vice versa.

A person skilled in the art will readily appreciate that various parameters disclosed in the description may be modified and that various embodiments disclosed and/or claimed may be combined without departing from the scope of the invention.

The invention claimed is:

1. A method for manufacturing a semiconductor device comprising an interconnect which includes electrically conductive portions forming an interconnect line and a dielectric layer made of a first dielectric material, said method comprising:
    forming a trench in the dielectric layer, said trench corresponding to said interconnect line, wherein the trench includes both side walls and a step;
    removing at least one damaged exposed portion of the dielectric layer from side walls of the trench, the damaged exposed portion being formed within the dielectric layer itself on both side walls and a step of the trench during said forming of the trench, wherein removing leaves the damaged exposed portion on the step; and
    depositing a dielectric liner on the side walls and step of the trench, said liner being made of a second dielectric material.

2. The method of claim 1, further comprising:
    anisotropically etching the deposited dielectric liner to open an underlying electrically conductive zone of the electrically conductive portions of the interconnect; and
    depositing a thin metallic barrier in the trench on the dielectric liner and underlying electrically conductive zone.

3. The method according to claim 2, further comprising:
    depositing a seed layer made of an electrically conductive material in the trench; and
    depositing a bulk made of the electrically conductive material via electroplating to fill the trench.

4. The method according to claim 3, further comprising:
    polishing to level the bulk of deposited electrically conductive material and a surface of the dielectric layer so as to produce a polished surface.

5. The method according to claim 4, further comprising:
    depositing a thin barrier of dielectric material on the polished surface.

6. The method of claim 1, further comprising:
    depositing a thin metallic barrier on the deposited dielectric liner; and
    anisotropically etching the deposited thin metallic barrier and the deposited dielectric liner to open an underlying electrically conductive zone of the electrically conductive portions of the interconnect.

7. The method according to claim 6, further comprising:
    depositing a seed layer made of an electrically conductive material in the trench; and
    depositing a bulk made of the electrically conductive material via electroplating to fill the trench.

8. The method according to claim 7, further comprising:
    polishing to level the bulk of deposited electrically conductive material and a surface of the dielectric layer so as to produce a polished surface.

9. The method according to claim 8, further comprising:
    depositing a thin barrier of dielectric material on the polished surface.

10. The method according to claim 1, wherein removing of the damaged exposed portion of the dielectric layer on the side walls is performed using a Hydrogen Fluoride based wet solution.

11. The method according to claim 1, wherein the first dielectric material is selected from the group consisting of silicon dioxide, carbon-incorporated silicon oxide, oxycarbide, Fluorine doped silicate Glass, Phosphosilicate Glass and boro-phospho-silicate glass.

12. The method according to claim 1, wherein the electrically conductive portions comprise copper.

13. A method, comprising:
    forming a trench having sidewalls, a step and a floor in a dielectric layer formed of a first dielectric material above a metal interconnect, wherein said trench corresponds to an interconnect line for a semiconductor device, and wherein forming causes damage to regions of the dielectric layer itself along the sidewalls and step;
    removing the damaged regions of the dielectric layer itself on the sidewalls to expose undamaged sidewalls of the dielectric layer; and
    depositing a conformal dielectric liner on the undamaged sidewalls, the damaged step and the floor, the dielectric liner being made of a second dielectric material.

14. The method of claim 13 further comprising:
    etching the conformal dielectric liner at least at the floor of the trench to expose the metal interconnect; and
    depositing a thin metallic barrier in the trench covering the etched dielectric liner and exposed metal interconnect.

15. The method of claim 13 further comprising:
    depositing a thin metallic barrier in the trench covering the conformal dielectric liner; and
    etching the thin metallic barrier and conformal dielectric liner at least at the floor of the trench to expose the metal interconnect.

16. The method of claim 13 further comprising filling the trench with a bulk electrically conducting material.

17. The method of claim 13, wherein removing the damaged regions of the dielectric layer on the sidewalls comprises performing a Hydrogen Fluoride based wet etch.

18. The method of claim 13, wherein the first dielectric material is selected from the group consisting of silicon dioxide, carbon-incorporated silicon oxide, oxycarbide, Fluorine doped silicate Glass, Phosphosilicate Glass and boro-phospho-silicate glass; and the second dielectric material is benzocyclobutene (BCB).

19. A method for manufacturing a semiconductor device comprising an interconnect which includes electrically conductive portions forming an interconnect line and a dielectric layer made of a first dielectric material, said method comprising:
    forming a trench in the dielectric layer said trench corresponding to said interconnect line, wherein the trench includes both side walls and a step, wherein said forming transforms the first dielectric material of the dielectric layer at the side walls and step of the trench into a damaged dielectric material;
    removing the damaged dielectric material of the dielectric layer along side walls of the trench, wherein removing the damaged dielectric material of the dielectric layer comprises removing the damaged dielectric material along the side walls of the trench while retaining the damaged dielectric material along the step of the trench; and depositing a dielectric liner on the side walls of the trench, said liner being made of a second dielectric material.

* * * * *